United States Patent
Kahng et al.

(10) Patent No.: US 7,873,929 B2
(45) Date of Patent: Jan. 18, 2011

(54) METHOD, APPARATUS AND SYSTEM FOR DESIGNING AN INTEGRATED CIRCUIT INCLUDING GENERATING AT LEAST ONE AUXILIARY PATTERN FOR CELL-BASED OPTICAL PROXIMITY CORRECTION

(75) Inventors: Andrew B. Kahng, Del Mar, CA (US); Chul-Hong Park, San Diego, CA (US)

(73) Assignee: The Regents of the University of California, Oakland, CA (US)

( * ) Notice: Subject to any disclaimer, the term of this patent is extended or adjusted under 35 U.S.C. 154(b) by 339 days.

(21) Appl. No.: 11/893,096

(22) Filed: Aug. 14, 2007

(65) Prior Publication Data

US 2008/0066041 A1   Mar. 13, 2008

Related U.S. Application Data

(60) Provisional application No. 60/837,575, filed on Aug. 14, 2006.

(51) Int. Cl.
G06F 17/50   (2006.01)
(52) U.S. Cl. .................................. 716/10; 716/8; 716/9
(58) Field of Classification Search ...................... 716/2, 716/4, 5, 8–14, 19–21
See application file for complete search history.

(56) References Cited

U.S. PATENT DOCUMENTS

2002/0003270 A1* 1/2002 Makino ...................... 257/390

2007/0168898 A1* 7/2007 Gupta et al. .................... 716/9

OTHER PUBLICATIONS

Cao, K., Dobre, S., Hu, J., "Standard Cell Characterization Considering Lithography Induced Variations." Proc. Of ACM/IEEE Design Automation Conferece, pp. 801-804 (2006).
Gupta, P., Heng, F., Lavin, M., "Merits of Cellwise Model-Based OPC." Proc. SPIE Conference on Design and Process Integration for Microelectronic Manufacturing. vol. 5379, pp. 182-189 (2004).
Gupta, P., Kahng, A., Park, C., "Detailed Placement for Improved Depth of Focus and CD Control." Proc. Asia and South Pacific Design Automation Conf., pp. 343-348 (Jan. 2005).
Gupta, P., Kahn, A., Nakagawa, S., Shah, S., Sharma, P., "Lithography Simulation-Based Full-Chip Design Analyses." Proc. SPIE Conference on Design and Process Integration for Microelectronic Manufacturing, pp. 61560T (2006).
Heng, F., Lee, J., Gupta, P., "Toward Through-Process Layout Quality Metrics." Proc. SPIE Conference on Design and Process Integration for Microelectronic Manufacturing. pp. 161-167 (May 2005).

(Continued)

*Primary Examiner*—Vuthe Siek
(74) *Attorney, Agent, or Firm*—Greer, Burns & Crain Ltd.

(57) ABSTRACT

Method and apparatus for designing an integrated circuit. A new layout is generated for at least one standard cell that incorporates an auxiliary pattern on a gate layer to facilitate cell-based optical proximity correction. An original placement solution is modified for a plurality of standard cells to permit incorporation of cells containing auxiliary patterns while improving an objective function of a resulting placement solution for the plurality of standard cells.

51 Claims, 9 Drawing Sheets

Vertical and Horizontal Auxiliary Patterns (AP)

Exemplary Design Flow Using Auxiliary Patterns

OTHER PUBLICATIONS

Kahng, A., Muddu, S., and Park, C., "Auxiliary Pattern-Based Optical Proximity Correction for Better Printability, Timing and Leakage Control." J. Micro/Nanolith. MEMS MOEMS, vol. 7, 013002 (2008).

Matsunawa, T., Nosato, H., Sakanashi, H., Murakawa, M., Murata, N., Terasawa, T., Tanaka, T., Yoshioka, N., Suga, O., Higuchi, T., "The Novel Approach for Optical Proximity Correction Using Genetic Algorithms." Proc. BACUS Symposium on Photomask Technology, 5992, pp. 54-1-54-9 (2005).

Wang, X., Pilloff, M., Tang, H. and Wu, C., "Exploiting Hierarchical Structure to Enhance cell-based RET with Localized OPC Reconfiguration." Proc. SPIE Conference on Design and Process Integration for Microelectronic Manufacturing, 5756, pp. 361-367 (2005).

* cited by examiner

Variant of Type-2 Auxiliary Pattern (AP)

METHOD, APPARATUS AND SYSTEM FOR DESIGNING AN INTEGRATED CIRCUIT INCLUDING GENERATING AT LEAST ONE AUXILIARY PATTERN FOR CELL-BASED OPTICAL PROXIMITY CORRECTION

PRIORITY CLAIM AND REFERENCE TO RELATED APPLICATION

This application claims priority under 35 U.S.C. §119 from prior related co-pending provisional application Ser. No. 60/837,575, which was filed on Aug. 14, 2006.

FIELD

Fields of the invention include integrated circuits and integrated circuit manufacturing.

BACKGROUND

Optical proximity correction (OPC) has been a key enabler of the aggressive IC technology scaling implicit in Moore's Law. Optical proximity correction determines the photomask patterns that enable drawn layout features to be faithfully and accurately reproduced by optical lithography onto a semiconductor wafer. However, the runtime of model-based optical proximity correction tools (i.e., software tools that use optical simulation and geometric operations to determine the photomask pattern for each layout feature) has grown unacceptably long with each successive technology generation, and has emerged as one of the major bottlenecks in the turnaround time for IC data preparation and manufacturing. Model-based optical proximity correction is typically used, but is responsible for the bottleneck in turnaround time.

Cell-based optical proximity correction has been proposed as a faster alternative to model-based optical proximity correction. The cell-based optical proximity correction approach is to run optical proximity correction once per each cell definition (i.e., per cell master) rather than once per placement or unique instantiation of each cell (i.e., per cell instance). In other words, in the cell-based optical proximity correction approach, the master cell layouts in the standard-cell library are corrected before placement, and then placement and routing steps of integrated circuit design are completed with the corrected master cells. Unfortunately, optical proximity effects in lithography have a certain interaction radius between layout pattern geometries. Since the neighboring environment of a cell in a full-chip layout is completely different from the environment of an isolated cell, the cell-based optical proximity correction solution can be incorrect when instantiated in a full-chip layout: as a result, there can be a large difference in feature critical dimensions between cell-based optical proximity correction and conventional model-based optical proximity correction.

SUMMARY OF THE INVENTION

Embodiments of the invention employ the use of auxiliary patterns that shield gate patterns at the cell outline from proximity effects and thus minimize the critical dimension difference between cell-based optical proximity correction and conventional model-based optical proximity correction. An embodiment of the invention provides methods and/or apparatus, such as software, for designing an integrated circuit including a plurality of cells, where each of the plurality of cells in the integrated circuit includes a plurality of transistors. Code in the software generates a new layout for at least one standard cell in the plurality of cells that incorporates an auxiliary pattern on a gate layer to facilitate cell-based optical proximity correction. Additionally, the software includes code for modifying an original placement solution of a plurality of standard cells in the plurality of cells to permit incorporation of cells containing auxiliary patterns while improving an objective function of a resulting placement solution for the plurality of standard cells. Embodiments of the invention further include integrated circuits designed according to inventive methods.

Methods and software of the invention also preferably make use of a methodology that inserts at least one vertical auxiliary pattern ("vertical-AP") between horizontally adjacent cells, i.e., neighboring cells in the same cell row, so that cell-based optical proximity correction achieves the accuracy comparable to conventional model-based optical proximity correction methods with significantly reduced runtimes.

BRIEF DESCRIPTION OF THE DRAWINGS

FIG. 2 (a) shows a Type-1 auxiliary pattern and FIG. 2(b) shows an enlarged view of the region 209 of FIG. 2(a);

FIG. 4 (a) shows an alternative Type-2 auxiliary pattern and FIG. 4(b) shows an enlarged view of region 406 of FIG. 4(a);

FIG. 6 (a) shows a combination of cells with Type-2 AP 601 and Type-1 AP 602; and FIG. 6 (b) shows a combination of cells with Type-2 AP 603 and Type-1 AP 604;

FIG. 7(a) shows overlapped auxiliary patterns; and FIG. 7(b) shows spaced apart auxiliary patterns;

DRAWINGS

Reference Numeral List

Figure 1:
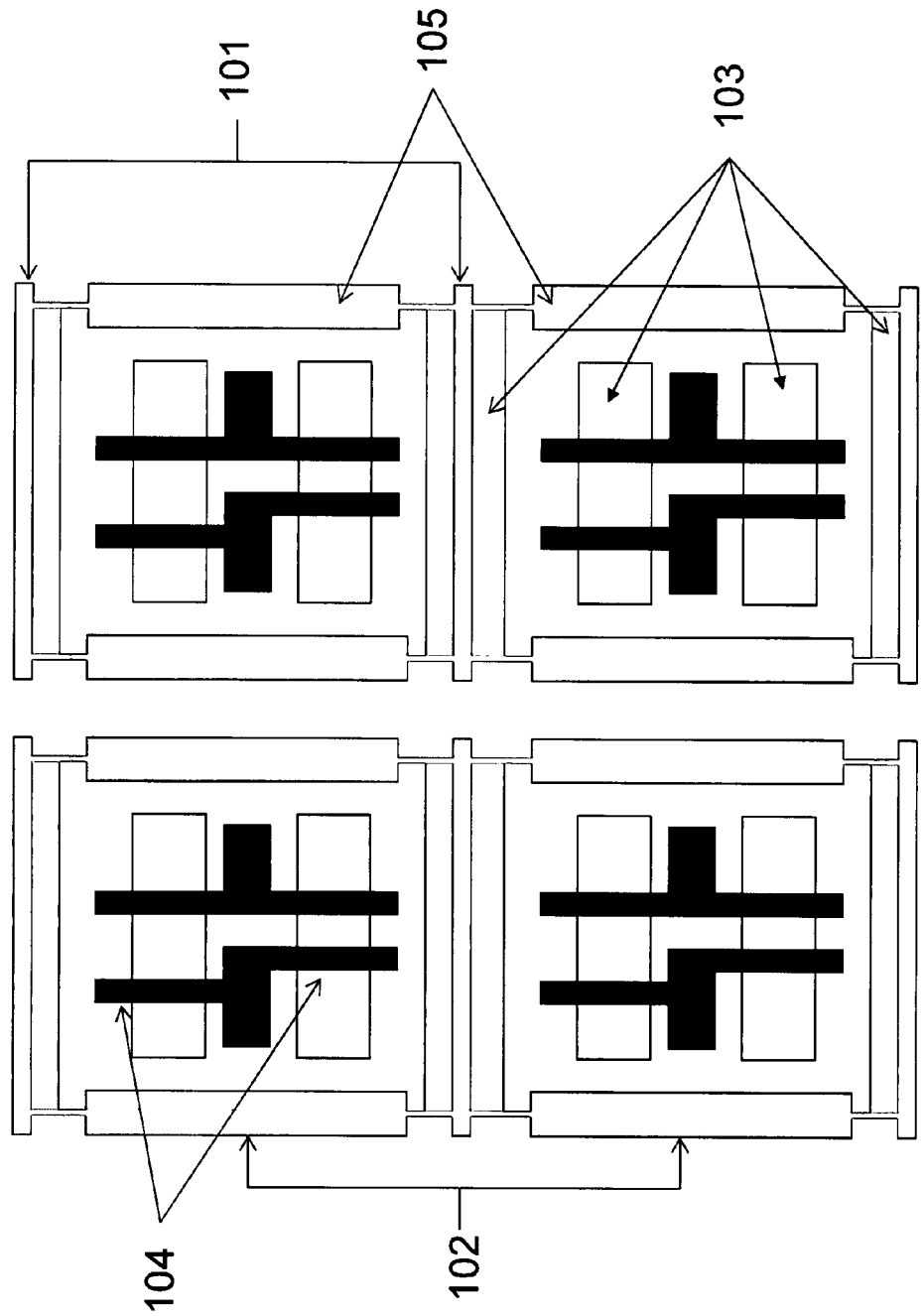
FIG. 1 shows a group of example of vertical (V-AP) and horizontal (H-AP) auxiliary patterns.

| | |
|---|---|
| 101 | Horizontal Auxiliary Pattern |
| 102 | Vertical Auxiliary Pattern |
| 103 | Active (or Diffusion) Layer |
| 104 | Gate Layer |
| 105 | Cell Outline |
| 201 | Horizontal Auxiliary Pattern |
| 202 | Vertical Auxiliary Pattern |
| 203 | Active (or Diffusion) Layer |
| 204 | Gate Layer |
| 205 | Space between End of Gate Layer and Active Layer |
| 206 | Space between Gate Layer and Vertical Auxiliary Pattern |
| 207 | Space between Active Layer and Vertical Auxiliary Pattern |
| 208 | Cell Outline |
| 209 | Area in the region 209 of (a) |
| 210 | Width between Cell Outline and Lower Edge of Horizontal Auxiliary Pattern |
| 211 | Width between Cell Outline and Upper Edge of Horizontal Auxiliary Pattern |
| 212 | Width between Cell Outline and Left Edge of Vertical |

-continued

| | |
|---|---|
| | Auxiliary Pattern |
| 213 | Width between Cell Outline and Right Edge of Vertical Auxiliary Pattern |
| 214 | Space between Active Layer and End of Vertical Auxiliary Pattern |
| 301 | Horizontal Auxiliary Pattern |
| 302 | Vertical Auxiliary Pattern |
| 303 | Active (or Diffusion) Layer |
| 304 | Gate Layer |
| 305 | Space between End of Gate Layer and Active Layer |
| 306 | Space between Gate Layer and Vertical Auxiliary Pattern |
| 307 | Space between Active Layer and Vertical Auxiliary Pattern |
| 308 | Cell Outline |
| 309 | Area in the region 309 of (a) |
| 310 | Width between Cell Outline and Lower Edge of Horizontal Auxiliary Pattern |
| 311 | Width between Cell Outline and Upper Edge of Horizontal Auxiliary Pattern |
| 312 | Width between Cell Outline and Left Edge of Vertical Auxiliary Pattern |
| 313 | Width between Cell Outline and Right Edge of Vertical Auxiliary Pattern |
| 314 | Space between Active Layer and End of Vertical Auxiliary Pattern |
| 401 | Fragment of Vertical Auxiliary Pattern Generated by Distance between Active Layer and Vertical Auxiliary Pattern |
| 402 | Fragment of Vertical Auxiliary Pattern Generated by Distance between Gate Layer and Vertical Auxiliary Pattern |
| 403 | Horizontal Auxiliary Pattern |
| 404 | Space between Active Layer and Vertical Auxiliary Pattern |
| 405 | Space between Gate Layer and Vertical Auxiliary Pattern |
| 406 | Area in the region 406 of (a) |
| 501 | Placement Sitewidth |
| 502 | Vertical Auxiliary Pattern |
| 503 | Horizontal Auxiliary Pattern |
| 504 | Space between Auxiliary Pattern and Active Layer |
| 505 | Space between Horizontal Auxiliary Pattern and Vertical Auxiliary Pattern |
| 601 | Cell with Type-2 Auxiliary Pattern |
| 602 | Cell with Type-1 Auxiliary Pattern |
| 603 | Cell with Type-3 Auxiliary Pattern |
| 604 | Cell with Type-1 Auxiliary Pattern |
| 701 | Overlapped Auxiliary Patterns |
| 702 | Space between Auxiliary Patterns |
| 801 | Cell Width of a-$1^{th}$ Cell |
| 802 | Cell Width of $a^{th}$ Cell |
| 803 | Distance between the right outline of the a-$1^{th}$ cell and the active geometry |
| 804 | Distance between the right outline of the a-$1^{th}$ cell and the gate |
| 805 | Distance between the left outline of the $a^{th}$ cell and the active geometry |
| 806 | Distance between the left outline of the $a^{th}$ cell and the gate |
| 807 | Leftmost placement coordinates of a-$1^{th}$ Cell in modified standard-cell |
| 808 | Leftmost placement coordinates of $a^{th}$ Cell in modified standard-cell |
| 901 | Original Standard Cell GDSII |
| 902 | AP Insertion Step |
| 903 | SRAF Insertion Step |
| 904 | OPC Run Step |
| 905 | OPCed Standard Cell GDSII |
| 906 | Original Placement |
| 907 | Run Post-Placement Optimization |
| 908 | Routing Step |
| 909 | Optimized Placement for Cell-Based OPC |
| 910 | Result of OPCed GDSII |

DETAILED DESCRIPTION OF PREFERRED EMBODIMENTS

The invention provides systems and methods for auxiliary pattern generation for cell-based optical proximity correction. Embodiments of the invention provide software that uses methods to overcome deficiencies of prior cell-based optical proximity correction approaches by generating auxiliary patterns for a standard-cell layout and, optionally, performing a post-placement optimization of a standard-cell block to increase the number of auxiliary patterns (and hence the quality of cell-based optical proximity correction) in the overall block design. Software of the invention processes an existing standard-cell layout (e.g., input in GDSII Stream format) and then generates a new standard-cell GDSII which has added into it auxiliary patterns as well as subresolution assist features (the latter type of features are known as "scattering bars", or SRAFs). Added auxiliary pattern features include vertical (V-AP) and/or horizontal (H-AP) auxiliary patterns. V-AP features print on the wafer and are located within the same cell row as the standard cell, while H-AP features do not print on the wafer and are located at the upper or lower boundaries of the cell row (i.e., H-AP features are oriented parallel to the cell row and are typically in the overlap region between adjacent cell rows). There are three types of V-APs according to the location of insertion: (1) Type-1 V-APs located at cell boundary, (2) Type-2 V-APs inserted with gate-to-auxiliary pattern and active-to-auxiliary pattern spacings, and (3) Type-3 V-APs located at the center of the placement sitewidth.

Embodiments of the invention also encompass a new restricted design rule approach (e.g., implemented by software) that enables the realization of standard-cell layouts with Type-1 V-AP, Type-2 V-AP, or Type-3 V-AP. The invention further encompasses the simultaneous use of any combination of the three types of auxiliary pattern. Because auxiliary patterns should have prescribed spacings to each other or be completely overlapped, a post-placement optimization step can be used to improve the benefit realized with auxiliary patterns for reuse of cell-based optical proximity correction solutions. Thus, embodiments of the invention also provide a cell placement approach that comprehends the available auxiliary patterns for each standard cell, and that can modify the standard-cell placement, consistent with the set of available auxiliary patterns for each cell, to improve the use of auxiliary patterns or other quality metrics. The modified standard-cell GDSII corresponding to any available auxiliary pattern insertion can then be incorporated into the modified cell placement. The auxiliary pattern insertion methodology provides significantly better critical dimension control than prior cell-based optical proximity correction approaches, and improved benefit with respect to cell-based timing optimization and characterization.

A preferred embodiment software tool of the invention successfully prevents optical proximity effects that extend across the limits of the cell, to avoid variation of the cell's critical dimensions and timing, and to avoid compromising neighboring circuit features and/or costing manufacturing yield to accommodate uncompensated proximity effects. In some prior approaches, dummy features are used to shield the cell from the different neighboring environments of the cell's instantiations. Dummy features are inserted at predetermined areas before performing optical proximity correction. The dummy feature, however, has limited ability to prevent proximity effects arising from or impinging on pattern geometries of neighboring cells, and critical dimension errors can remain after conventional cell-based optical proximity correction.

Example methods, software, and systems of the invention use auxiliary patterns at cell outlines to shield gate patterns from proximity effects and thus minimize the critical dimension difference between cell-based optical proximity correction and conventional model-based optical proximity correction. Embodiments of the invention further provide a design methodology that inserts at least one vertical auxiliary pattern between horizontally adjacent cells, i.e., neighboring cells in the same cell row, so that cell-based optical proximity correction achieves accuracy comparable to conventional model-based optical proximity correction methods with shorter runtimes.

Preferred embodiments will now be discussed with respect to the drawings. The drawings include schematic figures that are not to scale, which will be fully understood by skilled artisans with reference to the accompanying description. Features may be exaggerated for purposes of illustration. From the preferred embodiments, artisans will recognize additional features and broader aspects of the invention.

Auxiliary Pattern Generation

FIG. 1 illustrates a vertical-auxiliary pattern that prints on wafer and is located in the same cell row, as well as a horizontal-auxiliary pattern that does not print on wafer and is located in the overlap region between cell rows. Single-orientation gate geometries, for example formed with polysilicon in a silicon based integrated circuit fabrication, are becoming common for the current and future process generations. Gates may be made from any of various materials and/or methods, including known or to-be-known materials and/or methods. Gates are typically laid out vertically (assuming horizontal cell rows). Since impact of optical proximity on gate critical dimension is more interesting from a designer's perspective, patterns vertically laid out at cell boundaries within the same cell row should be shielded from proximity effects for maximum value and accuracy of cell-based optical proximity correction. The width of a vertical-auxiliary pattern 102 is larger than the minimum linewidth of a feature on a gate layer 104, while the width of horizontal-auxiliary pattern 101 is as small as that of a subresolution assist feature (SRAF). The horizontal-auxiliary pattern differs from the SRAF technique because the location of the SRAF depends on the distance between gate lines, while the auxiliary pattern is exactly located at the cell boundary 105. In general, there is an active or diffusion layer 103 at the boundary between different cell rows, and hence the horizontal-auxiliary pattern should not print on the wafer.

Figure 2:
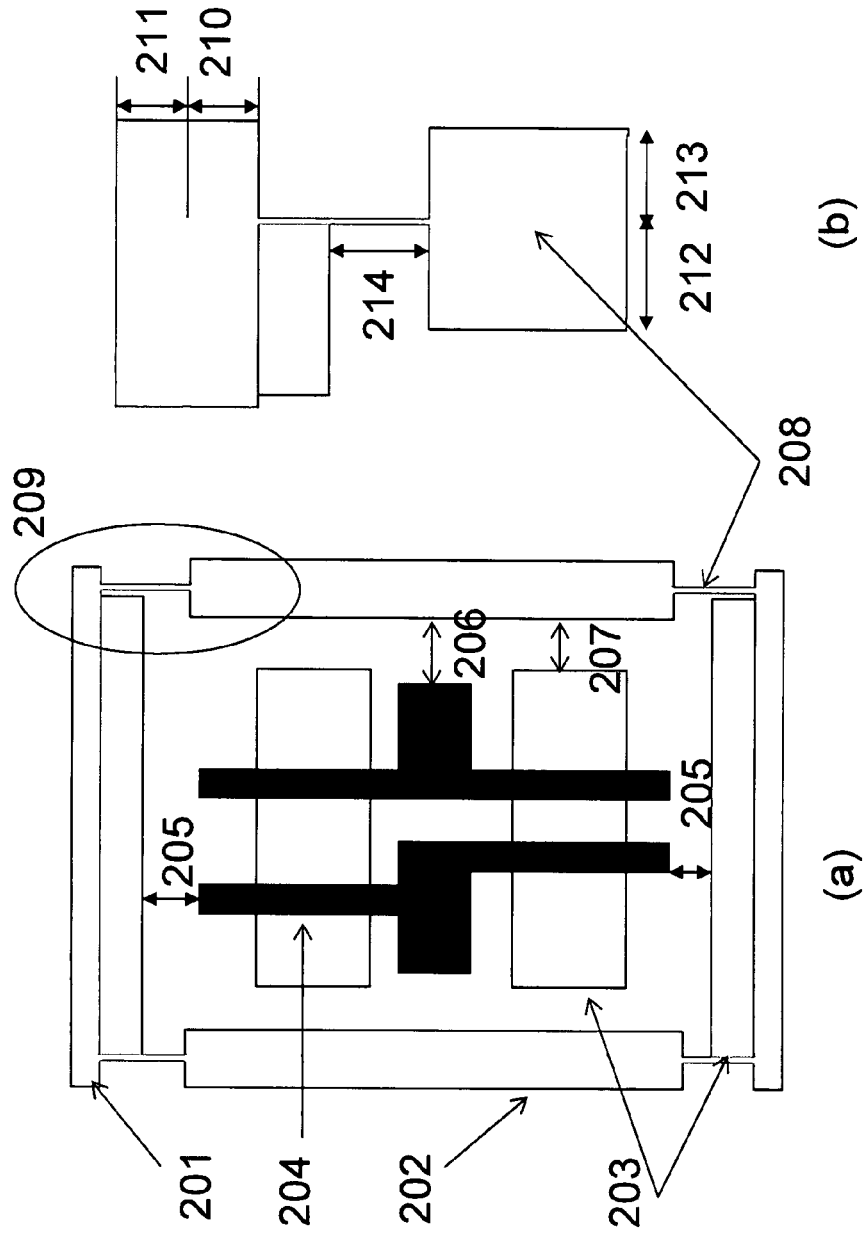

Type-1 AP. FIGS. 2(a) and 2(b) illustrate a Type-1 vertical-auxiliary pattern located at the center of (i.e., centered about) the cell outline, such that the left width—being the distance from cell outline to left edge of auxiliary pattern 212—is the same as the right width of the cell outline to right edge of auxiliary pattern 213. Spaces 206 and 207 respectively define space between border gate 204 and auxiliary pattern 202, and space between active-layer geometry 203 and auxiliary pattern 202. The Type-1 auxiliary pattern achieves minimum area penalty during cell placement compared to other types of auxiliary pattern. Thus, the Type-1 AP does not require a post-placement optimization. However, since spaces 206 and 207 in the typical standard cell are smaller than required minimum spaces, it is desirable for the pattern geometries of each standard cell to be modifiable to permit the instantiation of cells that embody a Type-1 AP.

Embodiments of the invention also include the use of a restricted design rule approach to realize cells with Type-1 AP for cell-based optical proximity correction. In FIG. 2(b), which is an enlargement of the region 209 of FIG. 2(a), 214 is the space between vertical-auxiliary pattern and active layer, and is the same as design rule 205, which is minimum space between gate line-end and active layer. The width from cell outline to bottom edge of horizontal-auxiliary pattern 210 is the same as the width between cell outline and top edge of auxiliary pattern 211.

Figure 3:
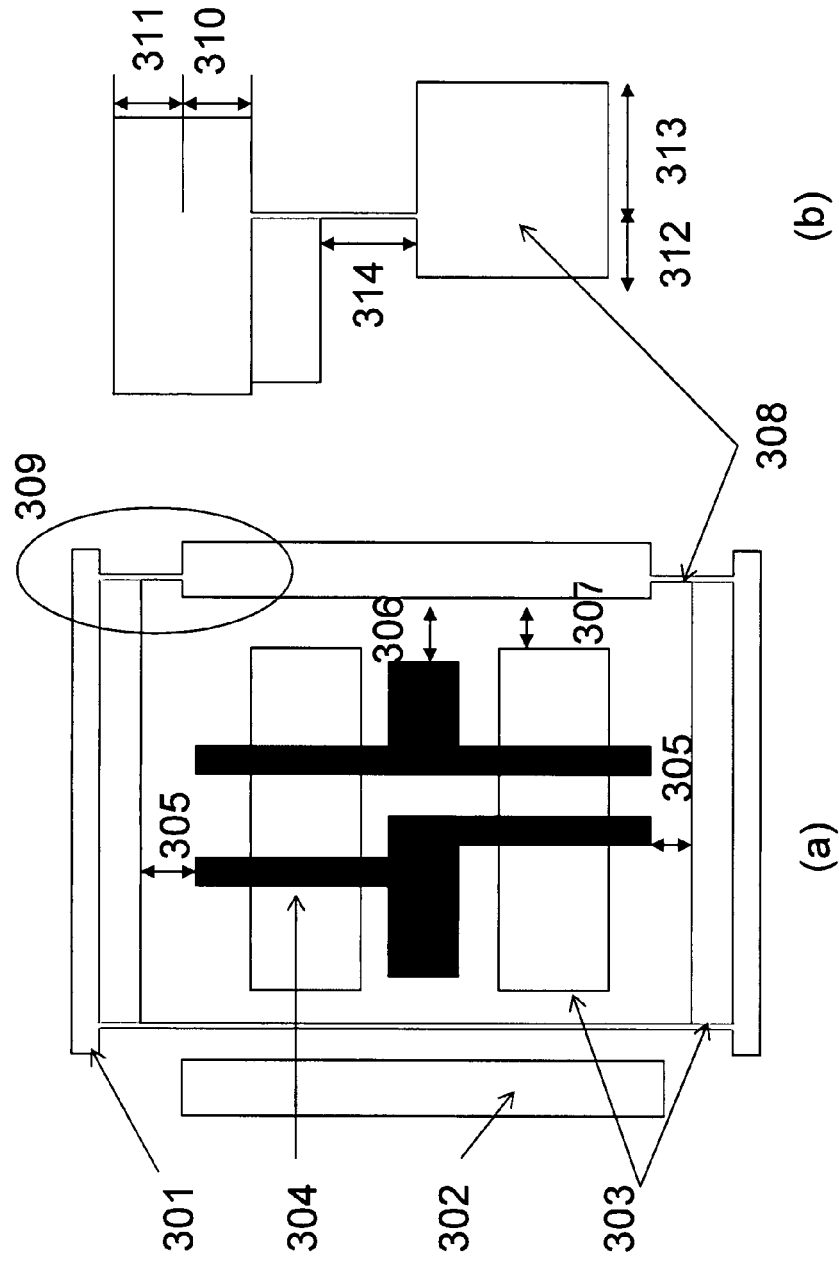
FIG. 3 shows (a) Type-2 auxiliary pattern and (b) an enlarged view of region 309 of FIG. 3(a)

Type-2 AP. FIGS. 3(a) and 3(b) show that in the case of violating minimum design rules of gate-to-gate and gate-to-active spaces in the Type-1 AP, a Type-2 AP represents a practical approach of integrating the auxiliary pattern construct within the standard-cell placement. Type-2 auxiliary pattern locations satisfy both 306 and 307 of minimum design rules. Width 312 is different from width 313. FIG. 3 also illustrates that the Type-2 AP can be placed at the outside of the cell outline.

Figure 4:
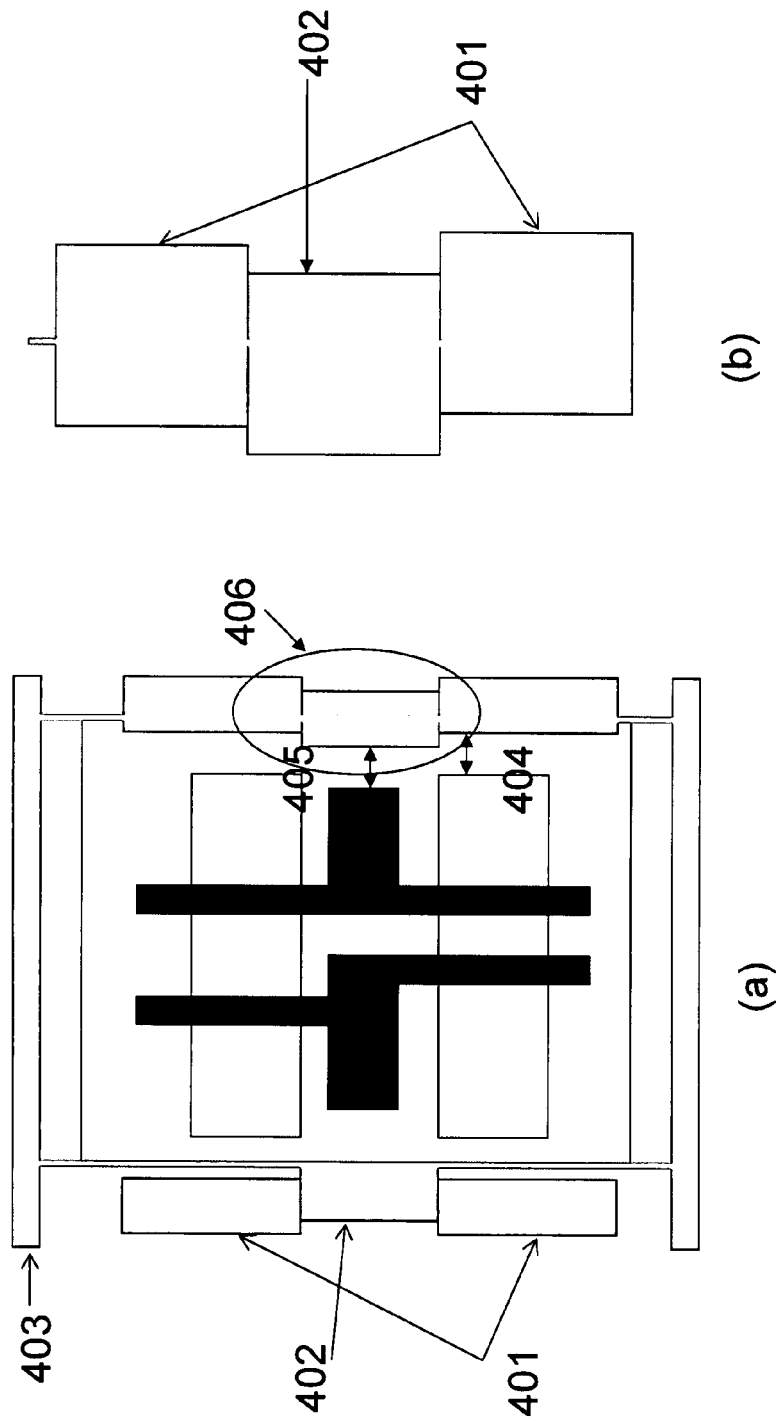

FIGS. 4(a) and 4(b) show an alternative Type-2 AP which includes fragments of polygons 401, 402, reflecting the spacing requirements that pertain to portions of gate geometries in the original cell layout. The locations of such Type-2 AP fragments are determined by required minimum spaces of gate-to-auxiliary pattern 405 and active-to-auxiliary pattern 404. The Type-2 AP increases area penalty during cell placement due to required auxiliary pattern-to-auxiliary pattern spacing.

Figure 5:
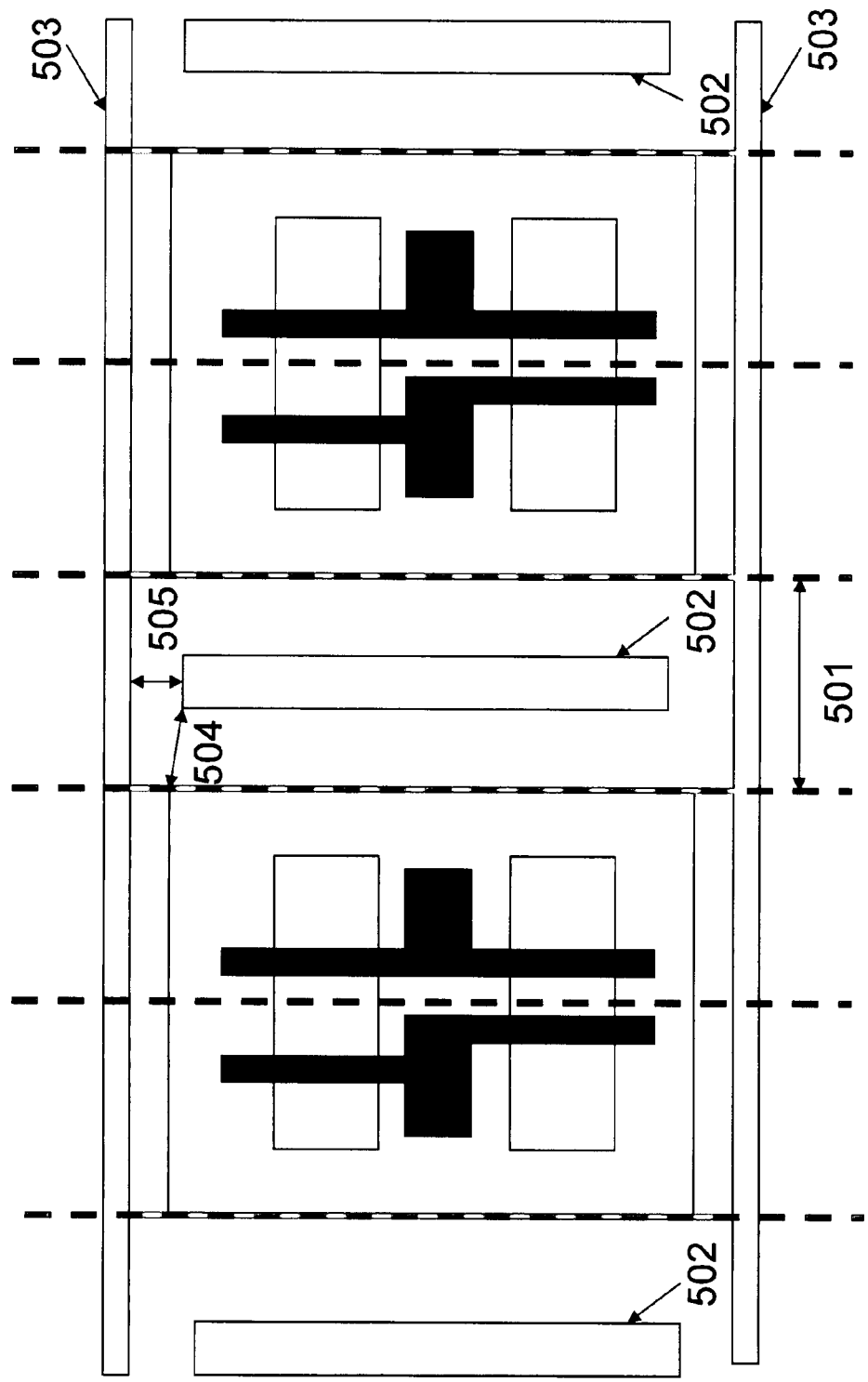
FIG. 5 shows a Type-3 auxiliary pattern.

Type-3 AP: FIG. 5 illustrates a Type-3 vertical-auxiliary pattern 502 that is placed at the center of the placement site 501. Since placing the Type-3 vertical auxiliary pattern at the center of the site achieves enough space between gate and auxiliary pattern, the Type-3 AP can maintain minimum space rules such as gate-to-gate and gate-to-active spaces while simultaneously minimizing area penalty. Note that vertical and horizontal auxiliary patterns 502, 503 each have rectangular shapes. For compatibility with design rule checks and other objectives, it can be beneficial, but is not required, to match a right end of a horizontal auxiliary pattern to a right edge of a right vertical auxiliary pattern, and/or to match a left end of a horizontal auxiliary pattern to a left edge of a left vertical auxiliary pattern.

Figure 6:
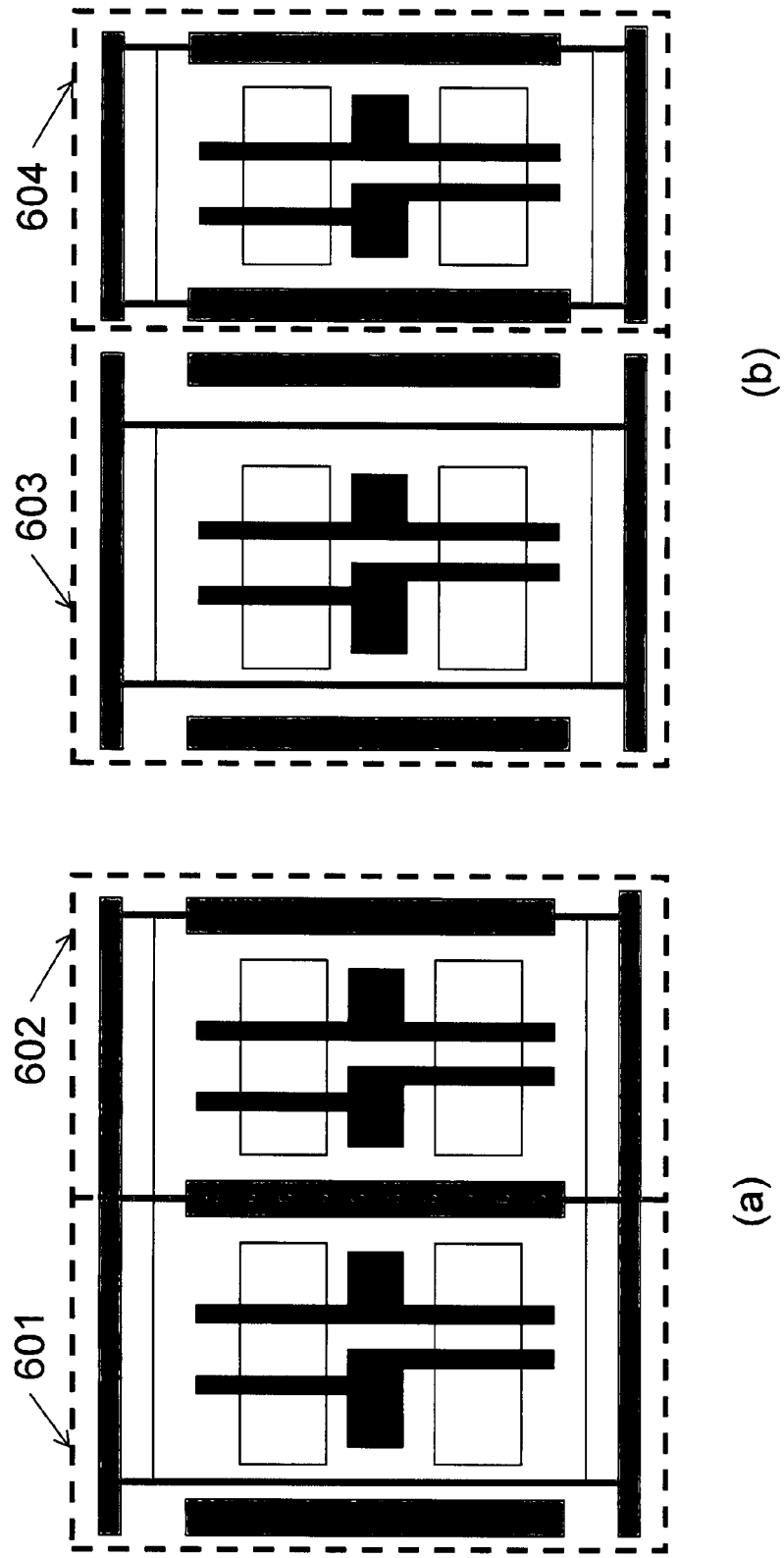
FIG. 6 shows examples of cell placements using cells with various types of auxiliary patterns.

Various auxiliary patterns can be constructed by combinations of the above three types of auxiliary patterns. FIG. 6 shows two examples: (a) a two-cell placement embodying a combination of cells with Type-1 602 and Type-2 601 auxiliary patterns; and (b) a two-cell placement embodying a combination of cells with Type-1 604 and type-3 603 auxiliary patterns. Thus, in the application of the auxiliary pattern technique, all combinations of all possible types of auxiliary pattern are feasible and can be considered. In particular, the examples of FIG. 6 should in no way be considered restrictive or limiting to the application of the auxiliary pattern technique.

Figure 7:
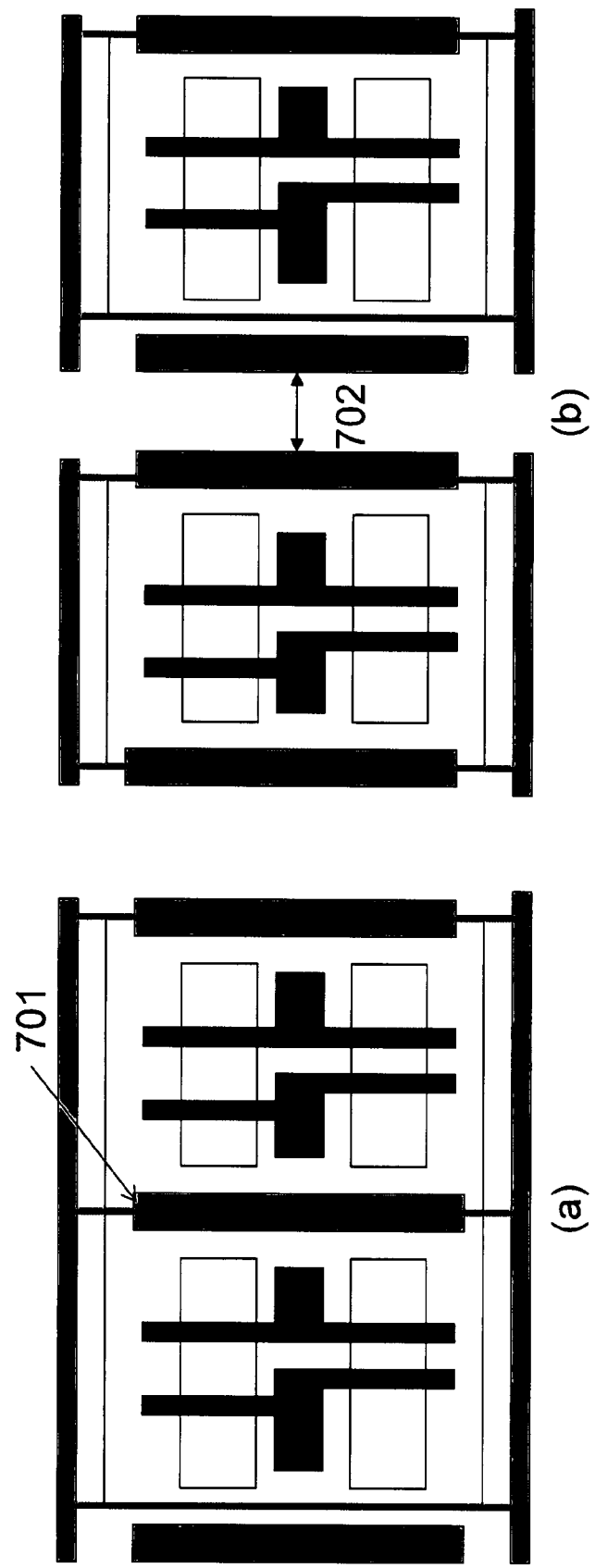
FIG. 7 shows examples of cell placements with overlap of, or spacing between, auxiliary patterns.

FIG. 7 illustrates that in some contexts, the auxiliary patterns should have certain required spacing 702 to each other or be completely overlapped 701.

Post-Placement Optimization

Recall from above that auxiliary patterns should have prescribed spacings to each other or be completely overlapped. A post-placement optimization step can improve the benefit of auxiliary patterns for reuse of cell-based optical proximity correction solutions. Embodiments of the invention also provide a cell placement approach that comprehends the available auxiliary patterns for each standard cell, and that can modify the standard-cell placement, consistent with the set of available auxiliary patterns for each cell, to improve the use of auxiliary patterns or other quality metrics. In a preferred embodiment, the modified standard-cell GDSII corresponding to any available auxiliary pattern insertion can then be incorporated into the modified cell placement. This will be described through an exemplary embodiment of an auxiliary pattern-correct placement perturbation algorithm for auxiliary pattern correction. It will be apparent to one skilled in the art that this exemplary embodiment is in no way restricting, and that the invention admits of any number of alternative embodiments.

Figure 8:
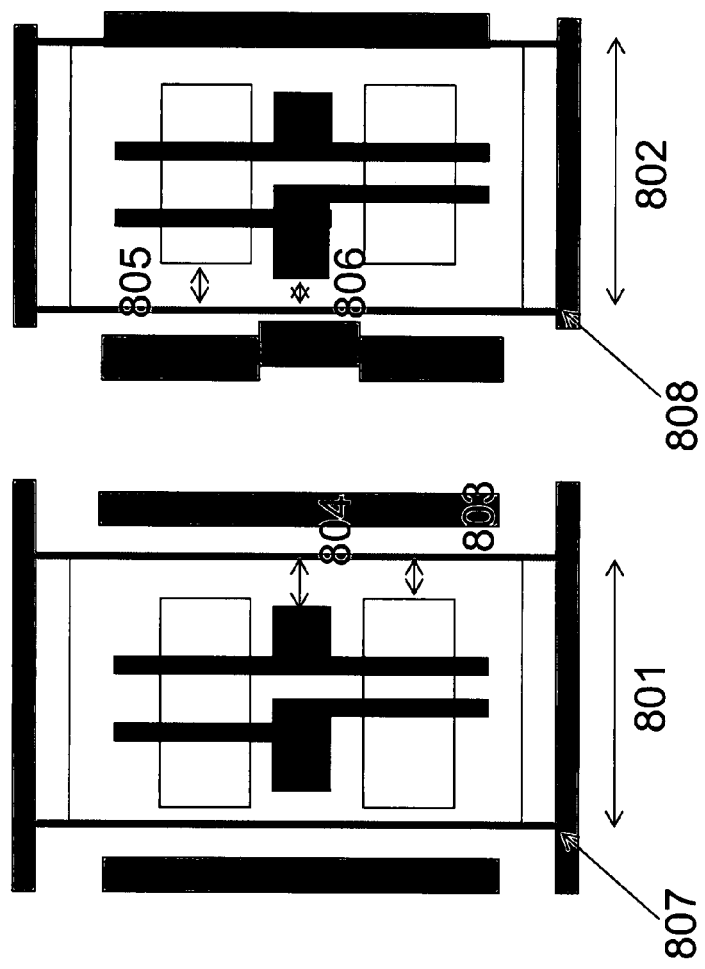
FIG. 8 shows a representation of a cell layout for purposes of placement optimization.

Given a cell $C_a$, let $LAP_a$ and $RAP_{a-1}$ be the sets of valid auxiliary pattern geometries in the cell which are located at the left and right outlines of the cell respectively. The following discussion is with respect to the illustration given in FIG. 8; note that $LAP_a$ and $RAP_{a-1}$ are not explicitly depicted in the figure. Define a to be the $a^{th}$ cell. Define $S^{AL}_a$ to be the space between the left outline of the $a^{th}$ cell and the active geometry 805, and $S^{AR}_{a-1}$ to be the space between the right outline of the $a-1^{th}$ cell and active layer 803. Similarly, define $S^{PL}_a$ to be the space between the left outline of the $a^{th}$ cell and the gate 806, and $S^{PR}_{a-1}$ to be the space between the right outline and the $a-1^{th}$ cell and gate layer 804. Define n to be the $n^{th}$ active geometry or the $n^{th}$ gate. $S^L_a$ and $S^R_{a-1}$ are defined as follows.

$$S^L_a = \min\{(S^{AL1}_a, \ldots, S^{ALn}_a), (S^{PL1}_a, \ldots, S^{PLn}_a)\}$$

$$S^R_{a-1} = \min\{(S^{AR1}_{a-1}, \ldots, S^{ARn}_{a-1}), (S^{PR1}_{a-1}, \ldots, S^{PRn}_{a-1})\}$$

Assume a set $AS=AS_1, \ldots, AS_m$ of spacings which are "auxiliary pattern-correct" ("AP-correct"), i.e., if the spacing of boundary shapes between cells belongs to the set AS, then the required number of auxiliary patterns can be inserted between cells. For example, $AS_1$ and $AS_2$ are the required spacing for one AP and two APs, respectively.

Let $W_a$ 802 denote the width of cell $C_a$ and let $x_a$ 807 and $x'_a$ 808 denote the (leftmost) placement coordinates of original standard-cell and modified standard-cell with type-i auxiliary pattern, respectively. Let $\delta$ denote a placement perturbation by which the modified standard cell will have an auxiliary pattern-correct spacing. Let $\delta_a$ denote a difference of $x_a$ and $x'_a$. Then the auxiliary pattern-correct placement perturbation problem may be formulated as:

Minimize $\Sigma |\delta_a|$ $(\delta_a + x^i_a) - (\delta_{a-1} + x^i_{a-1} + w_{a-1}) + S^R_{a-1} + S^L_a \in AS$ In this exemplary formulation, the objective is to minimize total placement perturbation from original cell-location and area penalty. It should be understood that any number of alternative objectives may be applicable, depending on the design goals for the integrated circuit; examples include but are not limited to: (1) minimizing the maximum perturbation of any cell's location from its original location, (2) minimizing the total timing-criticality-weighted perturbation of cell locations, (3) minimizing the total layout area penalty implicit in the instantiation of auxiliary pattern types and cell location perturbations, (4) minimizing any of the above objectives subject to a constraint on routability, etc. We may solve the above problem with any number of algorithmic approaches. In the following, we describe one example algorithmic approach, which is to solve for the perturbed placement locations of cells using a dynamic programming recurrence.

The auxiliary pattern correction problem can be solved by using the following cost function:

$\text{Cost}(1,b) = |x^i_1 - b|$ $\text{Cost}(a,b) = \lambda(a)|x^i_a - b| + \text{Min}_{j=x_{a-1}-srch}^{x_{a-1}+srch} \{\text{Cost}(a-1,j) + \text{Cost}(a,b,a-1,j)\}$ Define j to be the allowable perturbation at $x^i_{a-1}$. Cost (a, b) is the cost of placing cell a at placement site number b. The cells and the placement sites are indexed from left to right in the standard cell row. We restrict the perturbation of any cell to SRCH placement sites from its initial location. This helps contain the delay and runtime overheads of auxiliary pattern-correct placement post-processing.

In an embodiment of the present invention, $\lambda$ is a term that is associated with the relative importance of preserving the initial location of a cell in the standard cell layout. Therefore, $\lambda(a) |x^i_a - b|$ is a measure of the cost required to change the position of the cell. For example, if there are numerous critical timing paths that pass through a particular cell, the placement of the cell should not be changed. Hence, the value of $\lambda$ should be kept high. In an embodiment of the invention, $\lambda$ is kept directly proportional to the number of critical timing paths that pass through a cell.

---

APCost(a,b,a-1,j) of Cell $C_a$

Input:
   Origin x (left) coordinate and length of cell $C_a$ = b
   Origin x (left) coordinate and length of cell $C_{a-1}$ = j
   Width of cell $C_a$ = $w_a$
   Width of cell $C_{a-1}$ = $w_{a-1}$
Output:
   Value of APCost
Algorithm:
  01.Case a = 1 : APCost(1, b) = 0
  02.Case a > 1 Do
  /* For three AP types for left and right outline,
    callculate weight according to boundary geometries. */
  03.   space= $x^i_a - x^j_{a-1} - W_{a-1} + S^L_a + S^R_{a-1}$
  04.   if(space ≠ AS) weight = ∞
  05.   else weight = space
  06.   APCost(a, b, a - 1, j) += weight

---

Design Flow

Figure 9:
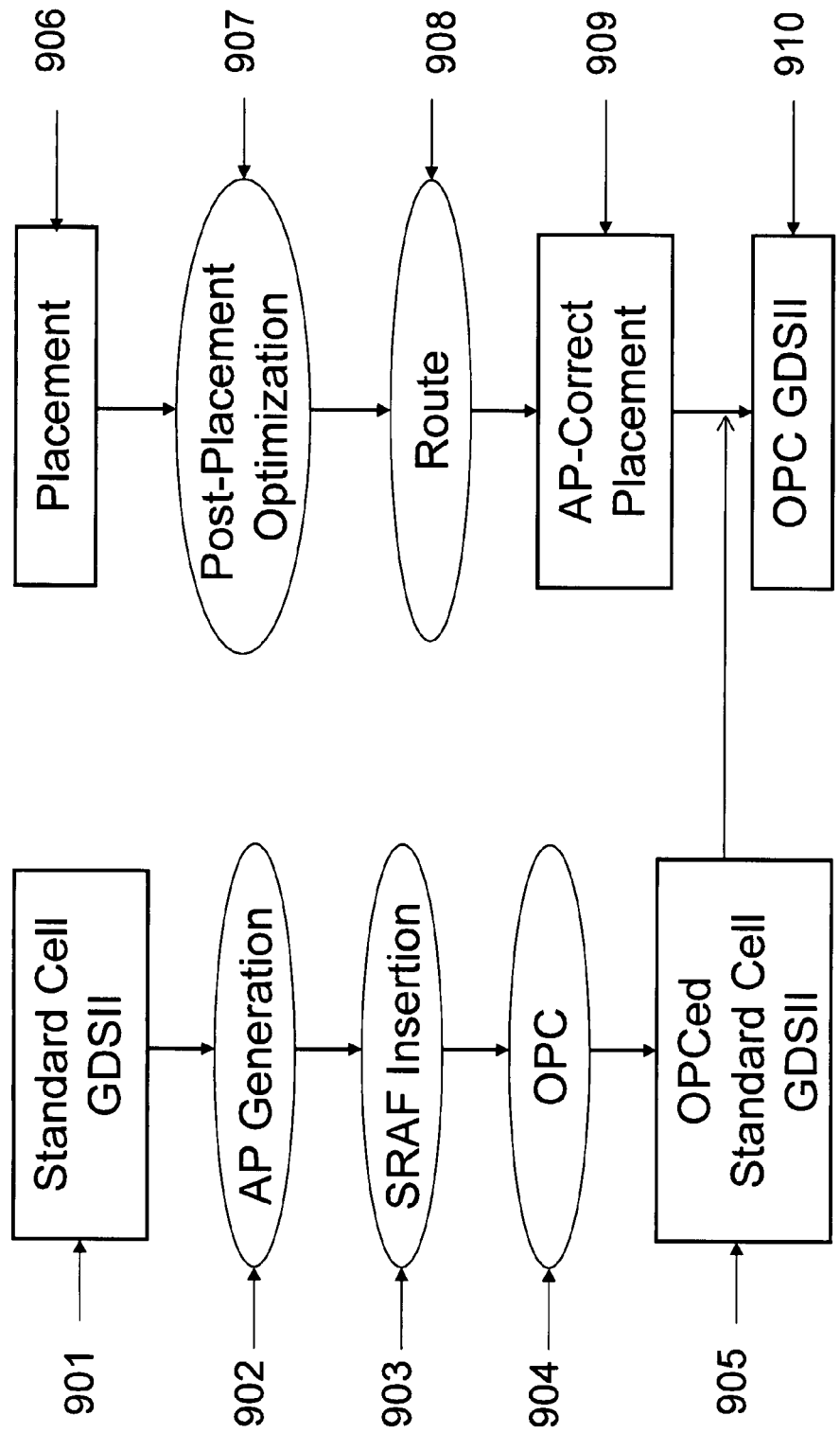
FIG. 9 shows an exemplary design flow using auxiliary patterns.

FIG. 9 is a block diagram of a system for auxiliary pattern generation and placement perturbation of layout objects in a standard-cell layout design, in accordance with an embodiment of the present invention. A standard-cell layout (e.g., GDSII) 901 is input to an auxiliary pattern generation step 902, and thence to an SRAF insertion step 903. (It is possible to interchange the order of application of SRAF insertion 903 and auxiliary pattern generation 902.) The resulting layout is input to optical proximity correction insertion step 904, which results in a set of OPCed standard-cell layouts (GDSII files) 905 corresponding to the master cells of the standard-cell library. These OPCed cell layouts 905 will be instantiated within the final layout according to the results of post-placement optimization 907, i.e., to achieve a high-quality cell-based optical proximity correction solution. The OPCed standard-cell layouts 905 include a plurality of layout objects, auxiliary patterns and SRAFs. It will be apparent to those skilled in the art that the OPCed layout pattern could also include other necessary features such as etch dummies, dummy fill features, and so forth. Also illustrated in FIG. 9, an original cell placement solution 906 is perturbed by post-placement optimization 907 (e.g., by the dynamic programming method described above) to admit the insertion of any combination of auxiliary pattern types and the design rule-correct overlap or spacing of auxiliary patterns. The post-placement optimization module 907 calculates the placement perturbation distances for a plurality of layout objects.

In an embodiment of the invention, the post-placement optimization module 907 further includes a cost minimizer. The cost minimizer determines a placement site in the standard-cell layout at which the cost of placing the cell is minimum. The cost minimizer minimizes the cost based on an objective such as the variation of critical dimension between cell-based optical proximity correction and conventional model-based optical proximity correction. The resulting perturbed cell placement is passed to a routing step 908, after which the final auxiliary pattern-correct placement 909 is available to cell-based optical proximity correction. As referred to above, "Auxiliary pattern-correct" ("AP-correct") means that the placement locations of one or more standard cell instances for which application of an auxiliary pattern is intended admit to design rule-correct instantiation of the corresponding combinations of auxiliary pattern types. The modified, auxiliary pattern-correct placement 909 takes the OPCed standard-cell layout 905 as an input. A final cell-based optical proximity correction layout (e.g., GDSII format) 910 is generated from the modified auxiliary pattern-correct placement 909 and the OPCed standard-cell layouts 905. The OPCed GDSII 910 minimizes the critical dimension difference between cell-based and conventional model-based optical proximity correction results, and, being a cell-based optical proximity correction solution, dramatically reduces total optical proximity correction runtime.

The system for designing an integrated circuit, as described in the present invention, or any of its components, may be embodied in the form of a computer system. Typical examples of a computer system include a general-purpose computer, a programmed microprocessor, a micro-controller, a peripheral integrated circuit element, and other devices or arrangements of devices that are capable of implementing the steps that constitute the method of the present invention.

The computer system comprises a computer, an input device, a display unit, and the Internet. The computer comprises a microprocessor, which is connected to a communication bus. The computer also includes a memory, which may include Random Access Memory (RAM) and Read Only Memory (ROM). The computer system further comprises a storage device which can be a hard disk drive or a removable storage drive such as a floppy disk drive, optical disk drive, and so forth. The storage device can also be other similar means of loading computer programs or other instructions into the computer system.

The computer system executes a set of instructions that are stored in one or more storage elements, in order to process input data. The storage elements may also hold data or other information, as desired. The storage element may be in the form of an information source or a physical memory element present in the processing machine. Exemplary storage elements include hard disk, DRAM, SRAM and EPROM. The storage element may also be external to the computer system, and connected to or inserted into the computer, for download at or prior to the time of use. Examples of such external computer program products are computer-readable storage media such as CD-ROMS, flash chips, floppy disks, and so forth.

The set of instructions may include various commands that instruct the processing machine to perform specific tasks, such as the steps that constitute the method of the present invention. The set of instructions may be in the form of a software program. The software may be in various forms, such as system software or application software. Further, the software might be in the form of a collection of separate programs, a program module with a larger program, or a portion of a program module. The software might also include modular programming in the form of object-oriented programming. The software program containing the set of instructions can be embedded in a computer program product, for use with a computer. The computer program product comprises a computer-usable medium having a computer-readable program code embodied therein. The processing of input data by the processing machine may be in response to user commands or in response to results of previous processing, or in response to a request made by another processing machine.

The invention may further be embodied in a cell layout produced by any of the embodiments of the present invention, and/or in one or more integrated circuits that are designed using any of the embodiments of the present invention.

While specific embodiments of the present invention have been shown and described, it should be understood that other modifications, substitutions and alternatives are apparent to one of ordinary skill in the art. Such modifications, substitutions and alternatives can be made without departing from the spirit and scope of the invention, which should be determined from the appended claims.

Various features of the invention are set forth in the appended claims.

The invention claimed is:

1. A method performed in a computer system for designing an integrated circuit, the integrated circuit comprising a plurality of cells, each of the plurality of cells comprising a plurality of transistors, the method comprising:
generating a new layout for at least one standard cell that incorporates at least one auxiliary pattern on a gate layer to facilitate cell-based optical proximity correction; and
modifying an original placement solution of a plurality of standard cells to permit incorporation of cells containing auxiliary patterns while improving an objective function of a resulting placement solution for the plurality of standard cells, wherein the objective function comprises at least one of minimizing timing-criticality-weighted perturbation of cell locations and minimizing maximum or average perturbation of a cell location from an original cell location.

2. The method according to claim 1, wherein said step of generating a new layout for the at least one standard cell incorporates at least one Type-1 vertical auxiliary pattern.

3. The method according to claim 1, wherein said step of generating a new layout for the at least one standard cell incorporates at least one Type-2 vertical auxiliary pattern.

4. The method according to claim 1, wherein said step of generating a new layout for the at least one standard cell incorporates at least one Type-3 vertical auxiliary pattern.

5. The method according to claim 1, wherein said step of generating a new layout for the at least one standard cell incorporates auxiliary patterns embodying one or more types from among the Type-1, Type-2, and Type-3 vertical auxiliary patterns.

6. An integrated circuit designed by the method of claim 5, wherein the integrated circuit comprises the plurality of standard cells and a plurality of gate patterns.

7. The method according to claim 1, wherein said step of generating a new layout for the at least one standard cell incorporates at least one horizontal auxiliary pattern.

8. The method according to claim 1, wherein said step of modifying the original placement solution optimizes the objective function.

9. The method according to claim 8, wherein the objective function seeks to minimize a weighted total distance of placement perturbation in the placement solution for the plurality of standard cells.

10. The method according to claim 8, wherein the objective function seeks to minimize a maximum distance of placement perturbation experienced by any one of the plurality of standard cells in the placement solution.

11. The method according to claim 8, wherein the objective function incorporates awareness of timing criticality or timing sensitivity of any of the plurality of standard cells in the placement solution.

12. The method according to claim 1, wherein said step of generating a new layout for the at least one standard cell incorporates at least one Type-1 vertical auxiliary pattern, the method further comprising calculating a layout modification of a gate layer or active layer or cell outline layer for auxiliary pattern insertion, wherein said step of modifying maintains required minimum spacing rules of gate-to-gate and gate-to-active spaces corresponding to vertical Type-1 auxiliary pattern-to-gate and vertical Type-1 auxiliary pattern-to-active spacings, respectively.

13. The method according to claim 12, wherein the space between the at least one vertical Type-1 auxiliary pattern and gate is equal to or larger than a design rule of minimum spacing between gate shapes.

14. The method according to claim 12, wherein the space between the at least one vertical Type-1 auxiliary pattern and active layer is equal to or larger than a design rule of minimum spacing between gate and active layer shapes.

15. The method according to claim 12, wherein the at least one vertical Type-1 auxiliary pattern is centered about a cell outline, and a left width distance from cell outline to left edge of the at least one vertical Type-1 auxiliary pattern is the same as a right width distance from cell outline to right edge of the at least one vertical Type-1 auxiliary pattern.

16. The method according to claim 12, wherein the space between the at least one vertical Type-1 auxiliary pattern end and active layer is equal to or larger than a design rule of minimum spacing between gate line-end and active layer.

17. The method according to claim 12, wherein the modified standard-cell layout with the at least one Type-1 auxiliary pattern has size that is a multiple of placement site size in the placement.

18. The method according to claim 12, wherein the at least one auxiliary pattern comprises at least one horizontal auxiliary pattern, and wherein the space between the at least one vertical Type-1 auxiliary pattern end and a horizontal auxiliary pattern is the same as a design rule of minimum space between gate lines.

19. The method according to claim 1, wherein said step of generating a new layout for the at least one standard cell incorporates at least one Type-2 vertical auxiliary pattern, the method further comprising calculating an auxiliary pattern objective generation rule by which the auxiliary pattern objective generation maintains minimum spacing rules of gate-to-gate and gate-to-active which correspond to vertical auxiliary pattern-to-gate and vertical auxiliary pattern-to-active spaces, respectively, and wherein the at least one vertical Type-2 auxiliary pattern is located based on the calculation of the spacings.

20. The method according to claim 19, wherein the space between the at least one vertical Type-2 auxiliary pattern and gate is equal to or larger than a design rule of minimum spacing between gate shapes.

21. The method according to claim 19, wherein the space between the at least one vertical Type-2 auxiliary pattern and active layer is equal to or larger than a design rule of minimum spacing between gate and active layer shapes.

22. The method according to claim 19, wherein the left width distance from cell outline to left edge of the at least one vertical Type-2 auxiliary pattern differs from the right width distance from cell outline to right edge of the at least one vertical Type-2 auxiliary pattern.

23. The method according to claim 19, wherein the space between the at least one vertical Type-2 auxiliary pattern end and active layer is equal to or larger than a design rule of minimum spacing between gate line-end and active layer shapes.

24. The method according to claim 19, wherein the space between the at least one vertical Type-2 auxiliary pattern end and horizontal auxiliary pattern is equal to or larger than a design rule of minimum spacing between gate lines.

25. The method according to claim 19, wherein the shapes of the at least one vertical Type-2 auxiliary pattern have either a rectangular geometry or polygonal geometries consisting of fragments of polygons.

26. The method according to claim 25, wherein for a vertical Type-2 auxiliary pattern with rectangular shape, the spacing rule satisfies at least one of (1) the space between vertical Type-2 auxiliary pattern and gate is the same as a design rule of minimum spacing between gate shapes, and (2) the space between vertical Type-2 auxiliary pattern and active layer is the same as a design rule of minimum spacing between gate and active layer shapes.

27. The method according to claim 25, wherein for a vertical Type-2 auxiliary pattern with polygonal shape, the locations of vertical Type-2 auxiliary pattern fragments are determined by required minimum spaces of gate-to-auxiliary pattern and active-to-auxiliary pattern.

28. The method according to claim 25, wherein the distance from a fragment of the at least one vertical Type-2 auxiliary pattern to the gate including gate area on active is equal to or larger than a design rule of minimum spacing between gate shapes, and the distance from a fragment of the at least one vertical Type-2 auxiliary pattern to the gate including contact overlap area is equal to or larger than the design rule of minimum spacing between gate shapes.

29. The method according to claim 1, wherein said step of generating a new layout for the at least one standard cell incorporates at least one Type-3 vertical auxiliary pattern, the method further comprising calculating an auxiliary pattern objective generation rule by which the auxiliary pattern objective generation maintains minimum space rules of gate-to-gate and gate-to active spaces which correspond to vertical auxiliary pattern-to-gate and vertical auxiliary pattern-to-active spaces, respectively, and wherein the at least one vertical Type-3 auxiliary pattern is located based on the calculation of the spacings.

30. The method according to claim 29, wherein the at least one vertical Type-3 auxiliary pattern is centered about the location or edge of a placement site.

31. The method according to claim 29, wherein the space between the at least one vertical Type-3 auxiliary pattern and gate is larger than a design rule of minimum spacing between gate shapes.

32. The method according to claim 29, wherein the space between the at least one vertical Type-3 auxiliary pattern and active layer is larger than a design rule of minimum spacing between gate and active layer shapes.

33. The method according to claim 29, wherein the space between the at least one vertical Type-3 auxiliary pattern end and active layer is equal to or larger than a design rule of minimum spacing between gate line-end and active layer shapes.

34. The method according to claim 1, wherein said step of generating a new layout for the at least one standard cell incorporates at least one horizontal auxiliary pattern, and wherein the at least one horizontal-auxiliary pattern is centered about an edge of the cell outline, such that the portion of the horizontal-auxiliary pattern width from cell outline to bottom edge of the at least one horizontal-auxiliary pattern is the same as the portion of the at least one horizontal-auxiliary pattern width between cell outline and top edge of the at least one horizontal-auxiliary pattern.

35. The method according to claim 34, wherein the space between the at least one vertical auxiliary pattern end and horizontal auxiliary pattern is equal to or larger than a design rule of minimum spacing between gate shapes.

36. The method according to claim 34, wherein the space between vertical auxiliary patterns is either zero or larger than a design rule of minimum spacing between gate shapes.

37. The method according to claim 1, the method further comprising:
calculating auxiliary pattern-correct spacings between vertical auxiliary patterns, and between vertical and horizontal auxiliary patterns.

38. An integrated circuit designed by the method of claim 1, wherein the integrated circuit comprises the plurality of standard cells and a plurality of gate patterns.

39. The method of claim 1, wherein at least one auxiliary pattern comprises at least one printed pattern and at least one non-printed pattern.

40. A method performed in a computer system for designing an integrated circuit, the integrated circuit comprising a plurality of cells, each of the plurality of cells comprising a plurality of transistors, the method comprising:
generating a new layout for at least one standard cell that incorporates at least one auxiliary pattern on a gate layer to facilitate cell-based optical proximity correction;
modifying an original placement solution of a plurality of standard cells to permit incorporation of at least one cell containing auxiliary patterns;
wherein said modifying comprises:
calculating a layout perturbation with concurrent objectives of minimizing area and/or timing penalty and minimizing critical dimension difference between cell-based optical proximity correction and conventional model-based optical proximity correction;
adjusting the layout of a plurality of standard cells according to the calculated layout perturbation; and
changing at least one original standard-cell instance to a modified standard-cell instance that includes at least one auxiliary pattern.

41. The method according to claim 40, wherein the modified standard-cell layout has size that is a multiple of placement site size in the placement.

42. The method according to claim 40, wherein the step of calculating the layout perturbation comprises determining a perturbation of at least one standard-cell instance such that the resulting spacings between layout features are auxiliary pattern-correct spacings.

43. The method according to claim 40, wherein the step of calculating the layout perturbation comprises:
determining a cost function for the at least one cell, said cost function being a measure of cost of placing the at least one cell at a placement site; and
applying the cost function to obtain a layout perturbation for the at least one cell instance.

44. The method according to claim 40, wherein the step of determining the cost function comprises determining a cost for placing the at least one cell in at least one alternative placement site.

45. The method according to claim 40, wherein the resulting optimized standard-cell placement includes standard-cell layouts corresponding to one or more types of auxiliary patterns.

46. The method according to claim 40, wherein the auxiliary pattern-correct spacing is either equal to zero or is larger than the required minimum auxiliary pattern-to-auxiliary pattern spacing.

47. A method performed in a computer system for designing an integrated circuit, the integrated circuit comprising a plurality of cells, each of the plurality of cells comprising a plurality of transistors, the method comprising:
determining available auxiliary patterns for each standard cell to be used in designing the integrated circuit; and
modifying an original standard-cell placement, consistent with the determined available auxiliary patterns for each standard cell instance while shielding gate patterns near cell outlines from proximity effects;
wherein the modified standard cell placement incorporates at least one vertical AP auxiliary pattern between all horizontally adjacent cells.

48. A computer program product comprising a physical storage element including software for designing an integrated circuit, the integrated circuit comprising a plurality of cells, each of the plurality of cells comprising a plurality of transistors, the software including code executed by a computer processor for:
generating a new layout for at least one standard cell that incorporates at least one auxiliary pattern on a gate layer to facilitate cell-based optical proximity correction; and
modifying an original placement solution of a plurality of standard cells to permit incorporation of cells containing auxiliary patterns while improving an objective function of a resulting placement solution for the plurality of standard cells, wherein the objective function comprises at least one of minimizing timing-criticality-weighted perturbation of cell locations and minimizing maximum or average perturbation of a cell location from an original cell location.

49. The computer program product of claim 48, wherein said step of generating a new layout for the at least one standard cell incorporates at least one Type-1 vertical auxiliary pattern, the software further comprising code for calculating a layout modification of a gate layer or active layer or cell outline layer for auxiliary pattern insertion, wherein said step of modifying maintains required minimum spacing rules of gate-to-gate and gate-to active spaces corresponding to vertical Type-1 auxiliary pattern-to-gate and vertical Type-1 auxiliary pattern-to-active spacings, respectively.

50. The computer program product according to claim 48, wherein said step of generating a new layout for the at least one standard cell incorporates at least one Type-2 vertical auxiliary pattern, the software further comprising code for calculation of an auxiliary pattern objective generation rule by which the auxiliary pattern objective generation maintains minimum spacing rules of gate-to-gate and gate-to-active which correspond to vertical auxiliary pattern-to-gate and vertical auxiliary pattern-to-active spaces, respectively, and wherein the at least one vertical Type-2 auxiliary pattern is located based on the calculation of the spacings.

51. The computer program product according to claim 48, wherein said step of generating a new layout for the at least one standard cell incorporates at least one Type-3 vertical auxiliary pattern, the software further comprising code for calculating an auxiliary pattern objective generation rule by which the auxiliary pattern objective generation maintains minimum space rules of gate-to-gate and gate-to active spaces which correspond to vertical auxiliary pattern-to-gate and vertical auxiliary pattern-to-active spaces, respectively, and wherein the at least one vertical Type-3 auxiliary pattern is located based on the calculation of the spacings.

* * * * *